United States Patent [19]

Ohuchida et al.

[11] Patent Number: 5,069,745
[45] Date of Patent: Dec. 3, 1991

[54] PROCESS FOR PREPARING A COMBINED WIRING SUBSTRATE

[75] Inventors: Hirofumi Ohuchida; Eishi Gofuku; Hayato Takasago; Akira Ishizu; Toshio Tobita; Mitsuyuki Takada, all of Amagasaki, Japan

[73] Assignee: Mitsubishi Denki Kabushiki Kaisha, Tokyo, Japan

[21] Appl. No.: 571,876

[22] Filed: Aug. 24, 1990

[30] Foreign Application Priority Data

Oct. 3, 1989 [JP] Japan .................. 1-259280

[51] Int. Cl.$^5$ .............. B44C 1/22; B29C 37/00; B32B 31/00; B23K 26/00
[52] U.S. Cl. .................. 156/630; 156/633; 156/643; 156/655; 156/272.8; 156/304.1; 219/121.69
[58] Field of Search ............ 156/630, 632, 633, 643, 156/655, 272.8, 293, 295, 299, 304.1, 304.6; 350/330, 343, 344; 428/1; 219/121.68, 121.69, 121.85

[56] References Cited

U.S. PATENT DOCUMENTS

| 4,405,971 | 9/1983 | Ohsawa | 361/401 |
| 4,526,649 | 7/1985 | Gupta et al. | 156/629 |
| 4,772,820 | 9/1988 | DiSanto et al. | 313/505 |
| 4,880,679 | 11/1989 | Bonazza | 156/304.1 X |
| 4,927,493 | 5/1990 | Yamazaki et al. | 156/272.8 X |

FOREIGN PATENT DOCUMENTS

| 0307990 | 3/1989 | European Pat. Off. . |
| 2716882 | 11/1977 | Fed. Rep. of Germany . |
| 2831984 | 2/1979 | Fed. Rep. of Germany . |
| 2904649 | 8/1979 | Fed. Rep. of Germany . |
| 3211025 | 10/1982 | Fed. Rep. of Germany . |
| 3633565 | 4/1988 | Fed. Rep. of Germany . |
| 3735455 | 9/1988 | Fed. Rep. of Germany . |
| 60-102613 | 6/1985 | Japan . |
| 60-191029 | 12/1985 | Japan . |
| 61-205916 | 9/1986 | Japan . |
| 62-124527 | 6/1987 | Japan . |

Primary Examiner—William A. Powell
Attorney, Agent, or Firm—Oblon, Spivak, McClelland, Maier & Neustadt

[57] ABSTRACT

A process for preparing a combined wiring substrate is carried out by bonding with an adhesive agent the end surfaces of the mutually opposing sides of a plurality of substrates each having a pattern of wiring on its major surface, and by connecting electrically parts of the pattern of wiring which oppose each other by interposing the bonding portion.

9 Claims, 7 Drawing Sheets

PROCESS FOR PREPARING A COMBINED WIRING SUBSTRATE

BACKGROUND OF THE INVENTION

1. Field of the Invention

The present invention relates to a process for preparing a combined wiring substrate. More particularly it relates to a process for preparing a large-sized combined wiring substrate by mechanically joining a plurality of substrates each having a pattern of wiring and by electrically connecting the patterns of wiring. The process is suitable for preparing a large-sized liquid crystal display by connecting mutually a plurality of independently prepared liquid crystal display substrates.

2. Discussion of Background

Much investment such as a manufacturing apparatus is required to produce a large-sized wiring substrate used for, for instance, a liquid crystal display device. Further, there are many problems that when a wiring substrate having a large surface area is to be prepared, possibilities of breaking of wire and short circuit due to deposition of dust during manufacturing steps increase; the electric characteristics become ununiform due to uneven quality of a film on the surface of the substrate, and it is difficult to transport or handle the substrate. Accordingly, it has been studied to combine a plurality of separately prepared wiring substrates to form a large-sized liquid crystal display.

In the following, an example of preparing a combined liquid crystal display will be described.

FIG. 8 is a cross-sectional view showing a conventional combined liquid crystal display disclosed, for instance, in Japanese Unexamined Patent Publication No. 124527/1987. In FIG. 8, a reference numeral 1 designates a circuit substrate for a liquid crystal display, a numeral 2 designates liquid crystal, a numeral designates an opposing substrate which opposes with a suitable space to the circuit substrate 1, a numeral 4 3 designates an adhesive agent to seal the space between the circuit substrate 1 and the opposing substrate 3, a numeral 5 designates a spacer to maintain the circuit substrate 1 and the opposing substrate 3 at a suitable gap, a numeral 6 designates a thin plate which sealingly closes an end plane of the liquid crystal display and a numeral 7 designates an adhesive agent to bond opposing liquid crystal display blocks each of which is constituted by the above-mentioned materials. A combined liquid crystal display which function as a large-sized single liquid crystal display is formed by arranging a number of the liquid crystal display blocks and by bonding the mutually opposing end surfaces of the blocks with an adhesive agent 7.

In the conventional combined liquid crystal display prepared by the above-mentioned process, there was a problem that a person who watch the display had a strange feeling because there were non-display regions between adjacent liquid crystal display blocks, which correspond to an area formed by several tends or more picture elements. Further, in the conventional process, the adjacent liquid crystal display blocks adjacent each other were not electrically connected. Accordingly, it was necessary to mount a circuit on each of the display blocks to drive them. It was not easy to mount the circuits.

SUMMARY OF THE INVENTION

It is an object of the present invention to provide a process for preparing a combined wiring substrate which allows to form a liquid crystal display having a large surface area without giving a strange feeling to a person who watches the liquid crystal display.

In accordance with the present invention, there is provided a process for preparing a combined wiring substrate which comprises bonding with an adhesive agent the end surfaces of the mutually opposing sides of a plurality of substrates each having a pattern of wiring on its major surface, and connecting electrically parts of the pattern of wiring which oppose each other by interposing the bonding portion.

In accordance with the present invention, there is provided a process for preparing a combined liquid crystal display which comprises a step of bonding with an adhesive agent of a high polymeric material the end surfaces of the mutually opposing sides of a plurality of substrates, a step of irradiating laser beams to a portion of the adhesive agent which projects from the surface of the substrates to thereby etch that portion so that the difference in level to the surface of the substrates is under 5 $\mu$m, and a step of arranging an opposing substrate above the substrate with a gap and sealing liquid crystal in the gap.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

In accordance with the present invention, a combined large-sized wiring substrate which has the same function as an integrated large-sized wiring substrate is formed by mutually connecting a number of separate wiring substrates. For instance, a combined liquid crystal display which functions as an integrated large-sized liquid crystal display is formed by mutually connecting a number of independent liquid crystal display substrates. In the present invention, a plurality of liquid crystal display blocks are not mutually connected, but the end surfaces of substrates for independent liquid crystal display elements are mechanically connected with a high polymeric series adhesive agent; the substrates for the independent liquid crystal display elements, which are adjacent to each other, are electrically connected through the connecting portions, and thereafter a combined liquid crystal display is formed by filling liquid crystal, by mounting opposing substrates and spacers and by applying an adhesive agent for sealing the liquid crystal.

Several embodiments of the present invention will be described with reference to the drawings.

Figure 1:
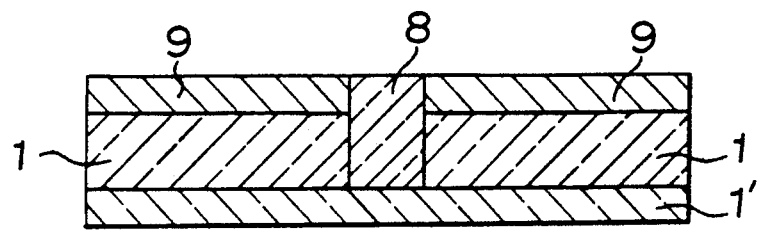
FIGS. 1a through 1c, FIGS. 2a through 2d, FIGS. 3a through 3d, FIGS. 4a through 4c, FIGS. 5a through 5d, FIGS. 6a through 6d and FIGS. 7a through 7c are respectively diagrams showing embodiments of the process for preparing a combined liquid crystal display according to the present invention.
Figure 1:
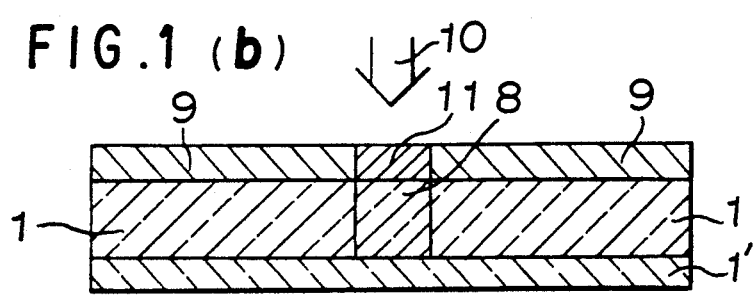
Figure 1:
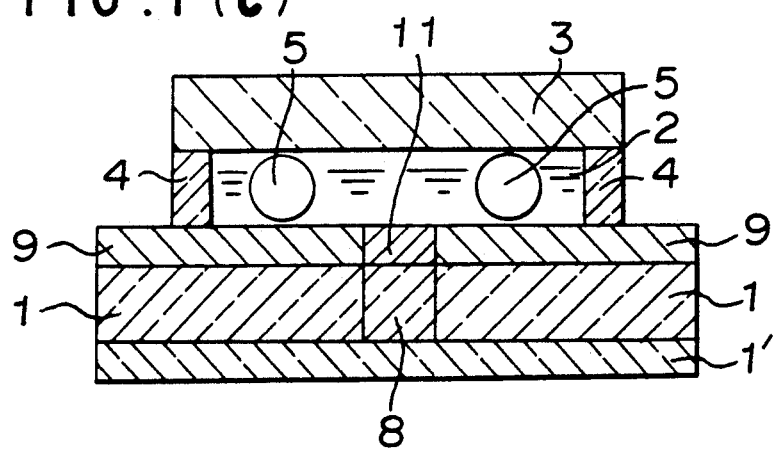

FIGS. 1a through 1c are cross-sectional views schematically illustrating an embodiment of the process for preparing a combined liquid crystal display according to the present invention in the order of manufacturing steps.

As shown in FIG. 1a, a high polymeric series adhesive agent 8 is coated on the end surface of a side of liquid crystal display circuit substrate 1 on which a pattern of wiring 9 which is to supply a voltage to an element for driving liquid crystal 2 is formed. Similarly, the high polymeric series adhesive agent 8 is coated on an end surface of another liquid crystal display circuit substrate 1. The circuit substrates applied with the adhesive agent 8 are joined by contacting the end surfaces applied with the adhesive agent 8. As the adhesive agent, an epoxy series adhesive agent (LGX-910-1 manufactured by Three Bond Inc.) is preferably used. A base substrate 1' is bonded to the back surface of the circuit substrates 1 in order to increase the mechanical strength. In order to remove an excessive amount of the adhesive agent which projects from the surface of the substrates at their contacting portions, beams having a high density of energy are applied to the projecting portion to make the joining portion flat. As the beam having a high density of energy, an excimer laser of ultraviolet ray region having a wavelength of 308 nm and an output of 1 mJ is preferably used.

Then, beams having a high density of energy 10 (in this case, a Nd: YAG laser having a wavelength of 1.06 $\mu$m and an output of 0.5 W, is irradiated to a part of the high polymeric series adhesive agent 8 at the joining portion between the adjacent circuit substrates 1 to carbonize that portion to thereby form a carbonized portion 11 as shown in FIG. 1b. Accordingly, the wirings on the adjacent circuit substrates 1 are electrically connected through the carbonized portion 11 to thereby form a combined liquid crystal display circuit substrate.

Then, an opposing substrate 3 is mounted on the combined circuit substrate 1 with a suitable space (such as about 5-10 $\mu$m) by using spacers 5, and the outer circumference between the opposing substrate 3 and the circuit substrate 1 is sealed with use of an adhesive agent 4. Thereafter, liquid crystal 2 is filled in the space to thereby form a combined liquid crystal display as shown in FIG. 1c. As the opposing substrate 3, an opposing substrate formed by bonding a plurality of opposing substrate may be used.

According to the above-mentioned embodiment of the present invention, since a plurality of the liquid crystal display circuit substrates are arranged in a side-by-side relation, the end surfaces facing each other being bonded, and the circuit substrates adjacent to each other are electrically connected, and the bonding region in the combined liquid crystal display can be reduced, whereby a large-sized display area can be easily obtained without giving a strange feeling to a person who watch the display.

Further, since the circuit substrates bonded to each other are mechanically and electrically connected, it is possible to handle it as if they are a single circuit substrate, and it is unnecessary to mount a driving circuit for each of the substrates. Thus, only a single driving circuit is sufficient and it is easily mounted to the combined liquid crystal display. Accordingly, the size of the liquid crystal display can be reduced.

Further, since the liquid display circuit substrates are separately manufactured as small units, the following problems can be eliminated: increase in breaking of a wire and short circuit due to deposition of dust at the time of film-forming in manufacturing a large-sized liquid crystal display circuit substrate; scattering in the electric characteristic due to ununiform quality of a film on the substrate, and difficulty in handling and transporting the substrate during the manufacturing steps. In accordance with the above-mentioned embodiment of the present invention, a conventional manufacturing apparatus can be used without modification to prepare a large-sized liquid crystal display with a high yield.

FIGS. 2a through 2d are diagrams showing another embodiment of the process for preparing a combined wiring substrate in the order of manufacturing steps.

In the same manner as the first embodiment, an epoxy series adhesive agent is applied to the end surfaces of liquid crystal display circuit substrates 1 and they are mutually bonded. A base substrate 1' is bonded to the back surfaces of the circuit substrates in order to increase the mechanical strength as shown in FIG. 2a.

Figure 2:
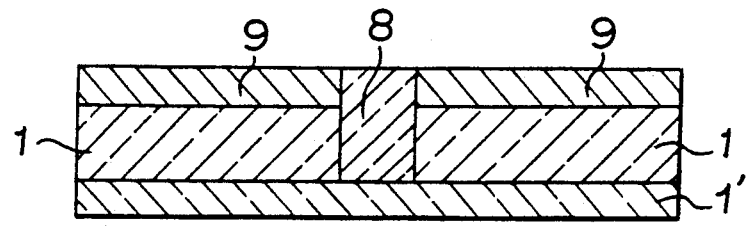
Figure 2:
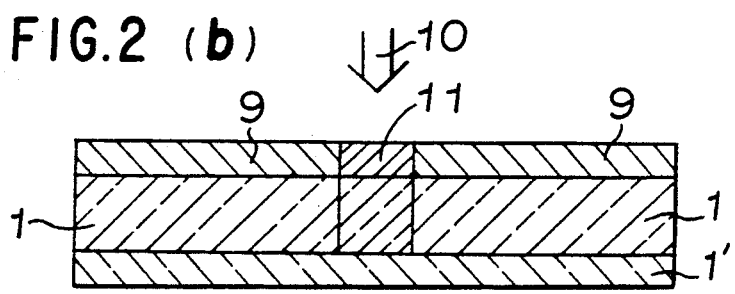
Figure 2:
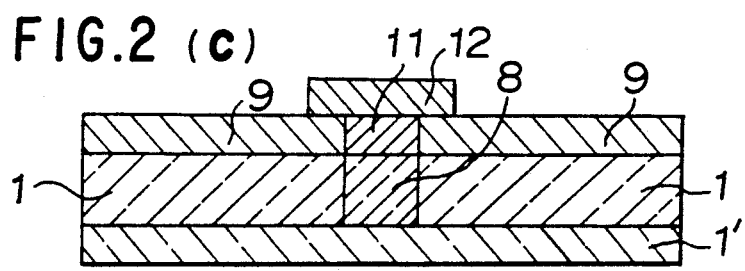
Figure 2:
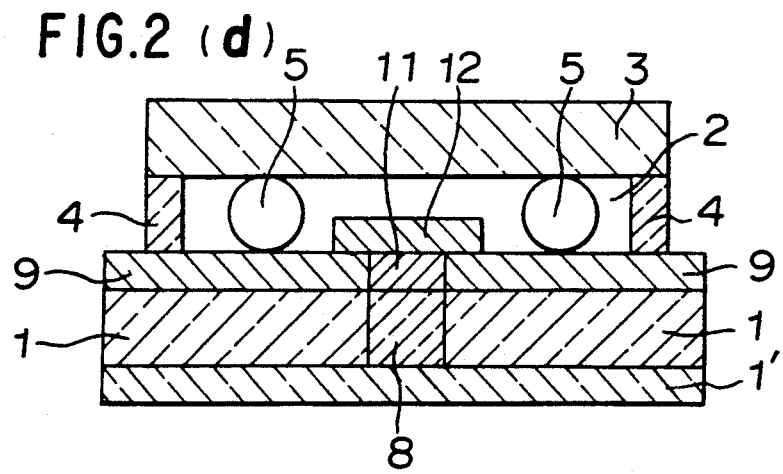

Beams having a high density of energy 10 is irradiated to a part of the adhesive agent 8 which projects from the joining portion between the adjacent circuit substrates 1 to form a carbonized portion 11 as shown in FIG. 2b.

Further, a thin metallic layer 12 as an electric conductive layer is formed by a chemical vapor deposition (CVD) method on the carbonized portion 11 which has been formed at a part of the joining portion between the circuit substrates as shown in FIG. 2c. Thus, by forming the electric conductive thin metallic layer 12 on the carbonized portion 11, the electrical connection of the wires 9 on the circuit substrates 1 can be certainly and stably achieved. In the Chemical Vapor Deposition (CVD) method, an excimer laser (of a wavelength of 308 nm) which oscillates in a ultraviolet region is used as beams having a high density of energy, and $W(CO)_6$ is used as a reaction gas. The thickness of the metallic layer 12 is about 2,000 Å.

Then, an opposing substrate 3 is mounted on the circuit substrates 1 which have been connected with a suitable space by using spacers 5. Then, the outer circumference of the opposite substrate 3 is sealed to the circuit substrate by using an adhesive agent 4. Liquid crystal 2 is filled in the space to thereby form a combined liquid crystal display. In the same manner as the first embodiment, the opposing substrate 3 may be formed by joining a plurality of opposing substrates.

In the second embodiment in which the conductive thin metallic film 12 is formed on the carbonized portion 11, the electrical connection of the wires 9 on the circuit substrates is certainly and stably achieved.

FIGS. 3a through 3d are diagrams showing another embodiment of the present invention.

Figure 3:
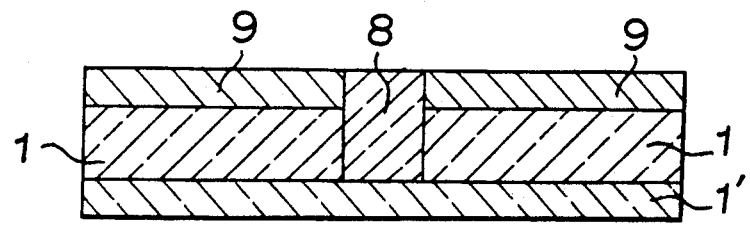
Figure 3:
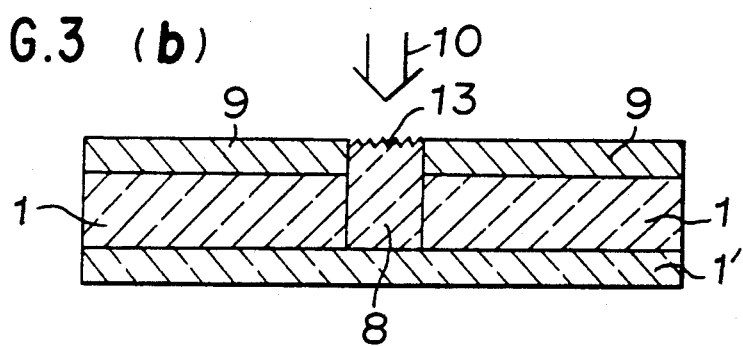
Figure 3:
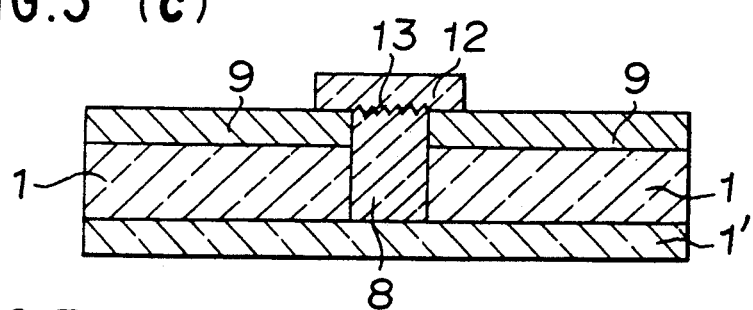
Figure 3:
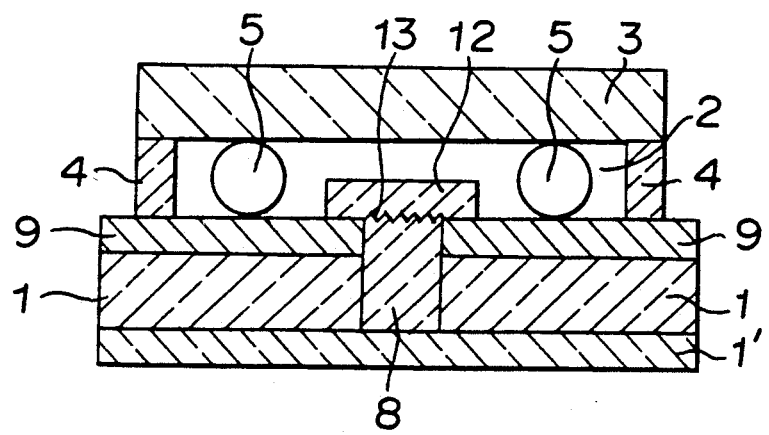

As shown in FIG. 3a, liquid crystal display circuit substrates 1 are arranged in a side-by-side relation, and the end surfaces of the circuit substrates 1 facing each other are bonded with an epoxy series adhesive agent. Further, a base substrate 1' is bonded to the back surface of the circuit substrates 1 in order to increase the mechanical strength.

Then, beams having a high density of energy 10 are irradiated to a part of the high polymeric series adhesive agent 8 at the joining portion of the circuit substrates 1 to thereby form a roughened surface area 13 as shown in FIG. 3b. As the beams having a high density of energy, the second high harmonics of an Nd: YAG laser (having a wavelength of 0.53 $\mu$m) is preferably used.

As shown in FIG. 3c, an electric conductive thin metallic layer 10 is formed by using a light CVD method on the roughened surface area 13 which has been formed by irradiating the beams having a high density of energy 10 to the high polymeric series adhesive agent 8 which has been used for joining the circuit substrates 1, whereby the electrical connection of the wires on the adjoining circuit substrates 1 can be certainly and stably achieved. For the light CVD method, an excimer laser (a wavelength of 308 nm) which oscillates in a ultraviolet region is preferably used as the beams having a high density of energy, and $W(CO)_6$ is preferably used as a reaction gas. The thickness of the thin metallic film 12 is preferably about 2,000 Å.

An opposing substrate 3 is mounted on the connected circuit substrates 1 with a suitable space by using spacers 5. The outer circumference of the opposing substrate 3 is sealed with respect to the connected circuit substrates 1 by using an adhesive agent 4. Liquid crystal 2 is filled in the space to thereby form a combined liquid crystal display. In this case, the opposing substrate 3 may be constituted by connecting a plurality of opposing substrates.

The combined liquid crystal display prepared in accordance with the third embodiment provides the same function as the above-mentioned embodiments.

FIGS. 4a through 4c, FIGS. 5a through 5d and FIGS. 6a through 6d are respectively diagrams of other embodiments of the processes of preparing a combined liquid crystal display in the order of manufacturing steps in accordance with the present invention.

In the fourth through sixth embodiments, an ultraviolet curing type adhesive agent is used as an adhesive agent which is cured by beams having a high density of energy. The steps which follow the step of curing the adhesive agent are the same as the above-mentioned embodiments.

Figure 4:
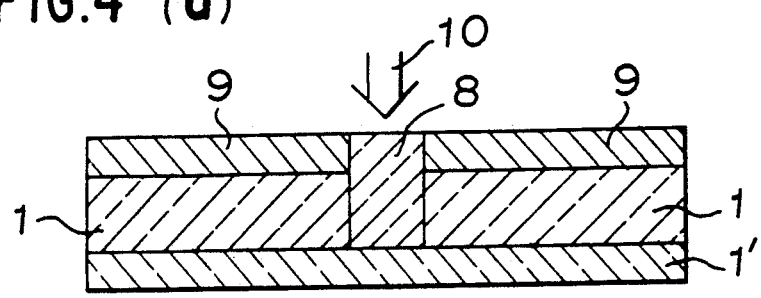
Figure 4:
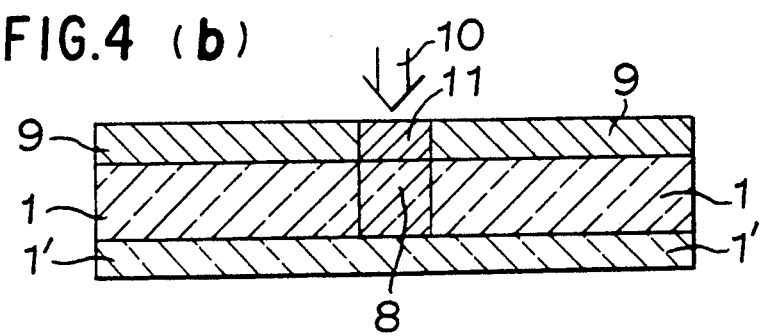
Figure 4:
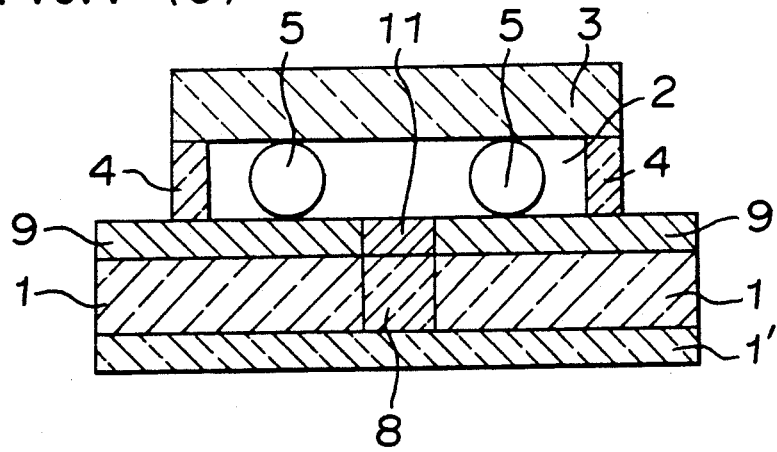
Figure 5:
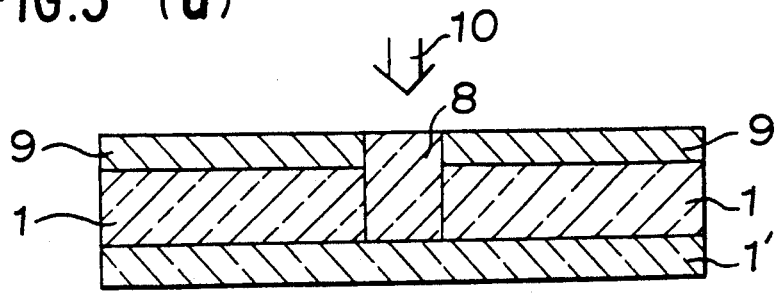
Figure 5:
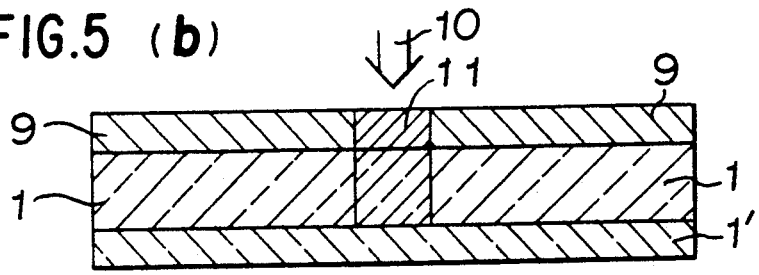
Figure 5:
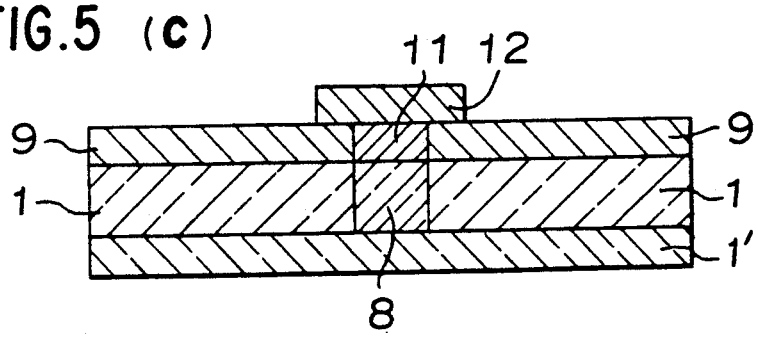
Figure 5:
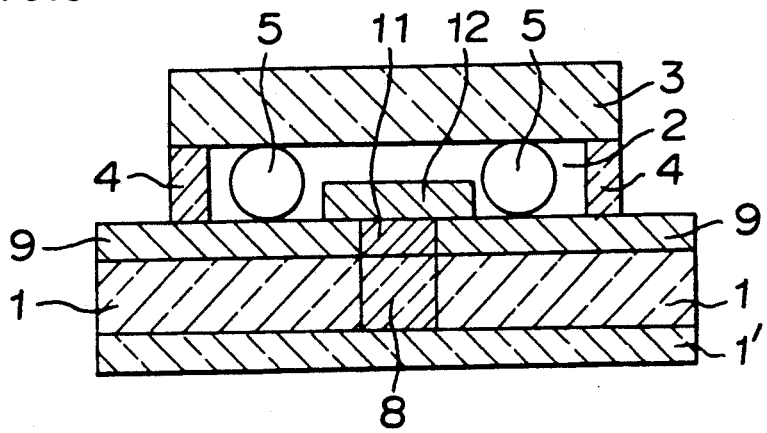
Figure 6:
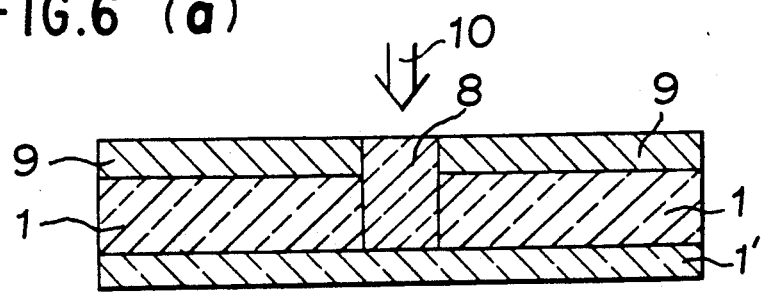
Figure 6:
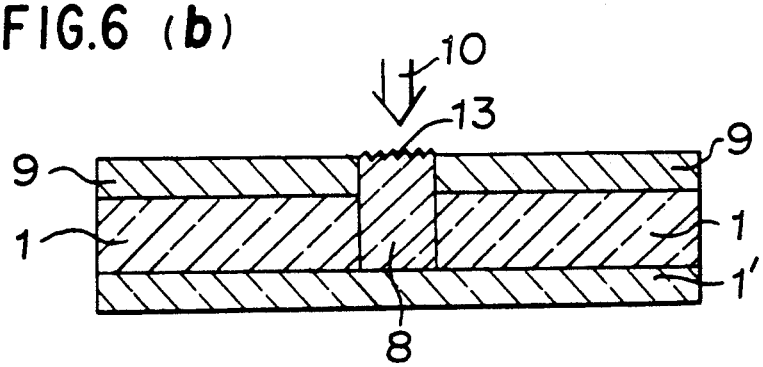
Figure 6:
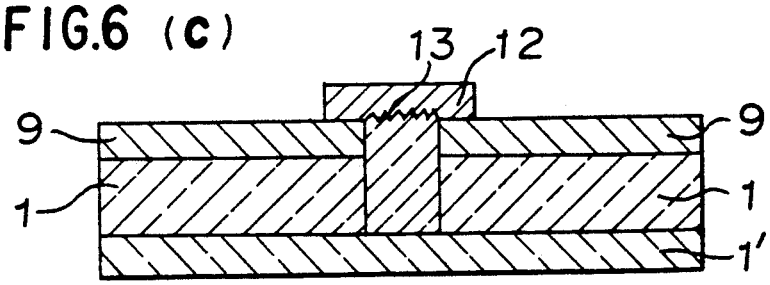
Figure 6:
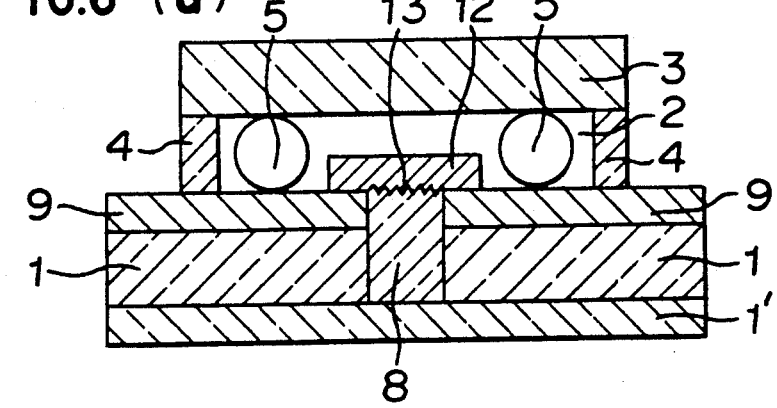

As shown in FIGS. 4a, 5a and 6a respectively, a high polymeric series adhesive agent 8 is coated on the end surfaces of the liquid crystal display circuit substrates 1, and the circuit substrates 1 are bonded by contacting the end surfaces coated with the adhesive agent. Beams having a high density of energy 10 are irradiated to the joining portion of the circuit substrates to cure the adhesive agent. In this case, as the adhesive agent, an ultraviolet curing type adhesive agent (for instance TB 3054 manufactured by Three Bond Inc.) is preferably used, and an excimer laser which oscillates in an ultraviolet region is preferably used as the beams having a high density of energy. The irradiation of the laser was conducted by using an exiting voltage of 20 kv and repeat number of 20 pps.

Then, the beams having a high density of energy 10 are irradiated to a part of the high polymeric series adhesive agent 8 which has been cured at the joining portion between the circuit substrates 1 to thereby form a carbonized portion 11 (FIG. 4b and FIG. 5b) or a roughened surface area 13 (FIG. 6b). Further, an electric conductive thin metallic layer 12 is formed on the carbonized portion 11 in the same manner as the above-mentioned embodiments (FIG. 5c), or an electric conductive thin metallic layer 12 is formed on the roughened surface area 13 in the same manner as the above-mentioned embodiments (FIG. 6c).

And then, a combined liquid crystal display is formed by using the connected circuit substrates 1 and other elements (FIG. 4c, FIG. 5d and FIG. 6d).

The seventh embodiment of the present invention will be described with reference to FIGS. 7a through 7c.

Figure 7:
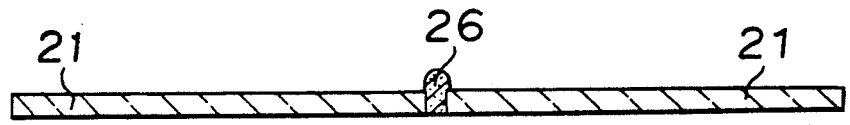
Figure 7:
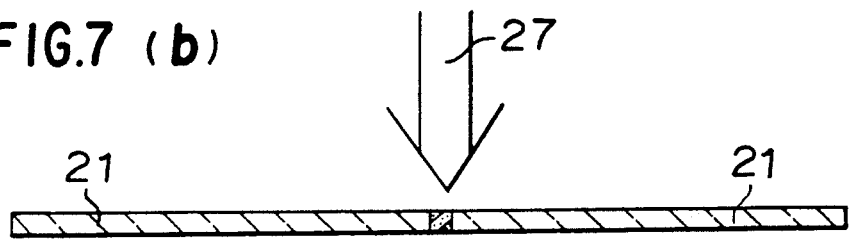
Figure 7:
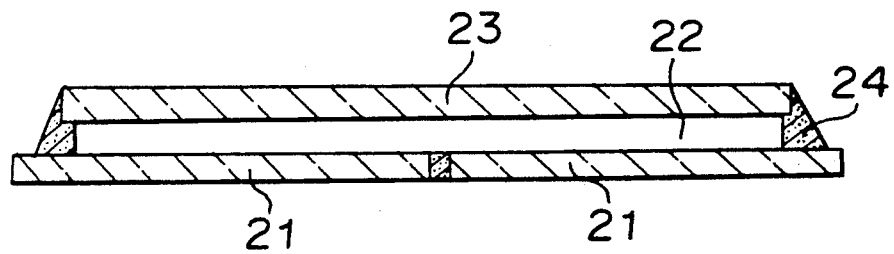
Figure 8:
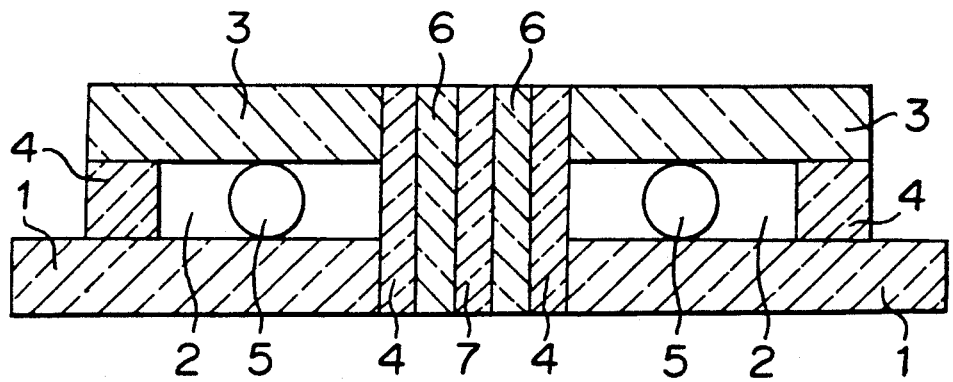
FIG. 8 is a diagram showing a conventional combined liquid crystal display.

As shown in FIG. 7a, a high polymeric series adhesive 26 is coated on end surfaces which face each other, of liquid crystal display circuit substrates 21, and the end surfaces of the circuit substrates 21 are mutually press-contacted to bond them. A base substrate (not shown) may be bonded to the back surface of the circuit substrates 21 in order to increase the mechanical strength. The thickness of the bonding portion at the end surfaces of the circuit substrates thus joined was about 50 $\mu$m which was smaller than the length of a side of a picture element in a liquid crystal display.

Since the adhesive agent 26 before curing is viscous, it projects from the surface of the circuit substrates 21 after the press-contact of the circuit substrates. As described hereinbelow, it is necessary that the distance between the circuit substrates 1 which are joined and an opposing substrate 23 is in a range of 5 $\mu$m-10 $\mu$m. Accordingly, if the adhesive agent projects toward the space, the projection is harmful to the formation of a uniform space. Further, when a pattern of wiring is formed on the adhesive projecting from the surface of the circuit substrates at the joining portion, a short circuit may take place to the opposing substrate 23. Accordingly, the projection of the adhesive agent has to be removed.

In FIG. 7b, laser beams 27 are irradiated to the adhesive agent projecting from the joining portion to etch the projection, whereby the difference in height between the surface of the circuit substrates 21 and the upper surface of the etched adhesive is 5 $\mu$m or less. As the laser beams 27, an excimer laser oscillating in an ultraviolet region (1 mJ) were irradiated for several seconds to give the difference of height to be in a range of 2-3 pm. A pattern of wiring may be formed after the smoothing operation as described above, whereby a driving circuit having a small size can be formed.

In FIG. 7c, the opposing substrate 23 is mounted on the joined circuit substrates 21 with a suitable amount of space (5 $\mu$m-10 $\mu$m) and the circumference of the opposing substrate 23 is sealed to the circuit substrates 21 by using an adhesive agent 24. Then, liquid crystal 22 is filled in the space to thereby form a combined liquid crystal display. The opposing substrate 23 may be constituted by joining a plurality of substrates in the same manner as the circuit substrates 21.

In the seventh embodiment, the ultraviolet curing type adhesive agent is used and the excimer laser oscillating in an ultraviolet region is used to cure the adhesive agent. Accordingly, a curing time of the adhesive agent is shortened and the mechanical bonding between the substrates can be easy.

For the adhesive agent, a polyimide series, an urethane series, an acryl series or another suitable adhesive agent may be used other than the epoxy series adhesive agent and the ultraviolet curing type adhesive agent. Further, an inorganic adhesive agent may be used. For instance, sodium silicate (water glass) can be used so long as it is unnecessary to heat when used.

In the above-mentioned embodiments, description has been made as to use of beams having a high density of energy to cure the ultraviolet curing type adhesive agent. However, another suitable means may be used. Further, a combination of a thermosetting type adhesive agent and beams having a high density of energy for curing the adhesive agent may be used. In this case, an Nd: YAG laser of continuous wave (CW) is preferably used under the condition of a power of 0.5 W, a spot diameter of 100 μm and a scanning speed of 10 mm/sec, as the beams having a high density of energy, for instance.

The base substrate is not always necessary to reinforce the joined circuit substrates. However, it is useful when a guide member is formed on it so as to determine the position of the circuit substrates which are to be joined on the base substrate. This facilitates to join a number of circuit substrates on the base substrate.

Further, the electric conductive thin metallic layer may be formed by a vapor deposition method, a plating method, a spattering method or the like other than the optical CVD method. In addition, an electric conductive organic layer made of a material such as polyacetylene, poly-p-phenylene, polypyrol or the like may be formed by using the above-mentioned method.

In the above-mentioned embodiments, the first high harmonics of an Nd: YAG laser is used as the beams having a high density of energy for carbonizing a high polymeric material; the second high harmonics of an Nd: YAG laser is used as the beams having a high density of energy for forming a roughened surface area on a high polymeric material, and an excimer laser is used as the beams having a high density of energy in order to carry out the optical CVD method. However, a $CO_2$ gas laser may be used as the beams having a high density of energy for the carbonizing and the roughening depending on a kind of a high polymeric material. An Ar laser or an Xe laser may be used depending on a material which is formed by the optical CVD method. In the present invention, laser beams are not always necessary, and electron beams, ion beams or another beams having a high density of energy can be used. These beams can be suitably selected depending on a kind of materials to be used.

The present invention can be applied not only to the preparation of a liquid crystal display substrate, but also the preparation of an LSI (Large Scale Integrated Circuit) substrate, a printed wiring substrate or another wiring substrate.

In accordance with the present invention, a wiring substrate having a large surface area can be easily manufactured efficiently. It is unnecessary to form a driving circuit for each substrate because the wirings on the substrates are electrically connected. In a combined liquid crystal display substrate, a bonding area between adjoining circuit substrates, i.e. a non-display region can be reduced, whereby a liquid crystal display having a large display surface area can be obtained without giving a strange feeling to a person who watches the display.

Obviously, numerous modifications and variations of the present invention are possible in light of the above teachings. It is therefore to be understood that within the scope of the appended claims, the invention may be practiced otherwise than as specifically described herein.

What is claimed is:

1. A process for preparing a combined wiring substrate which comprises bonding with an adhesive agent the end surfaces of the mutually opposing sides of a plurality of substrates each having a pattern of wiring on its major surface, and electrically connecting parts of the pattern of wiring which oppose each other by interposing the bonding portion.

2. The process for preparing a combined wiring substrate according to claim 1, wherein said adhesive agent is a high polymeric series adhesive agent, and beams having a high energy density are irradiated to a part of the bonding part to thereby produce a carbonized portion through which the electrical connection is effected.

3. The process for preparing a combined wiring substrate according to claim 1, wherein said adhesive agent is a high polymeric series adhesive agent; beams having a high density of energy are irradiated to a part of the bonding part to thereby form a carbonized portion, and an electric conductive layer is formed on the carbonized portion whereby adjacent substrates are electrically connected.

4. The process for preparing a combined wiring substrate according to claim 1, wherein said adhesive agent is a high polymeric series adhesive agent; beams having a high density of energy are irradiated to a part of the bonding part to thereby form a roughened surface area, and an electric conductive layer is formed on the roughened surface whereby adjacent substrates are electrically connected.

5. A process for preparing a combined liquid crystal wiring substrate which comprises bonding with an adhesive agent the end surfaces of the mutually opposing sides of a plurality of substrates each having a pattern of wiring on its major surface, and electrically connecting parts of the pattern of wiring which oppose each other by interposing the bonding portion.

6. The process for preparing a combined liquid crystal wiring substrate according to claim 5, wherein said adhesive agent is a high polymeric series adhesive agent, and beams having a high energy density are irradiated to a part of the bonding part to thereby produce a carbonized portion through which the electrical connection is effected.

7. The process for preparing a combined liquid crystal wiring substrate according to claim 5, wherein said adhesive agent is a high polymeric series adhesive agent; beams having a high density of energy are irradiated to a part of the bonding part to thereby form a carbonized portion, and an electric conductive layer is formed on the carbonized portion whereby adjacent substrates are electrically connected.

8. The process for preparing a combined wiring substrate according to claim 5, wherein said adhesive agent is a high polymeric series adhesive agent; beams having a high density of energy are irradiated to a part of the bonding part to thereby form a roughened surface area, and an electric conductive layer is formed on the roughened surface area whereby adjacent substrates are electrically connected.

9. A process for preparing a combined liquid crystal display which comprises:
a step of bonding with an adhesive agent of a high polymeric material the end surfaces of the mutually opposing sides of a plurality of substrates,
a step of irradiating laser beams to a portion of the adhesive agent which projects from the surface of the substrates by the press-contacting of them to thereby etch that portion so that the difference in level to the surface of the substrates is under 5 μm, and
a step of arranging an opposing substrate above the substrate with a gap and sealing a liquid crystal in the gap.

* * * * *